United States Patent [19]
Murota

[11] Patent Number: 5,491,113
[45] Date of Patent: Feb. 13, 1996

[54] METHOD OF MANUFACTURING SEMICONDUCTOR DEVICE HAVING A PLANARIZED SURFACE

[75] Inventor: Masayuki Murota, Yokohama, Japan

[73] Assignee: Kabushiki Kaisha Toshiba, Kawasaki, Japan

[21] Appl. No.: 401,063

[22] Filed: Mar. 8, 1995

[30] Foreign Application Priority Data

Mar. 10, 1994 [JP] Japan ..................................... 6-039592

[51] Int. Cl.⁶ ......................... H01L 21/302; H01L 21/463
[52] U.S. Cl. ..................... 437/225; 437/228; 156/636.1; 216/38
[58] Field of Search .............................. 216/38, 88–90; 148/DIG. 19–20; 437/225, 228, 192, 193, 195; 156/636.1, 637.1, 645

[56] References Cited

U.S. PATENT DOCUMENTS 5,272,117  12/1993  Roth et al. .............................. 437/228
5,298,110   3/1994  Schoenborn et al. ................. 156/636.1
5,395,801   3/1995  Doan et al. ............................. 437/225

Primary Examiner—George Fourson
Assistant Examiner—H. Jey Tsai
Attorney, Agent, or Firm—Loeb and Loeb

[57] ABSTRACT

In a method of manufacturing a semiconductor device, an interlayer insulating film is formed along a surface of a semiconductor substrate having a stepped surface. A stopper surface is formed at least at a recess in the interlayer insulating film. The interlayer insulating film and the stopper film are polished until the interlayer insulating film and the stopper film are exposed on the same plane. The stopper film remaining after the polishing is etched and removed. The interlayer insulating film is polished and flattened.

3 Claims, 3 Drawing Sheets

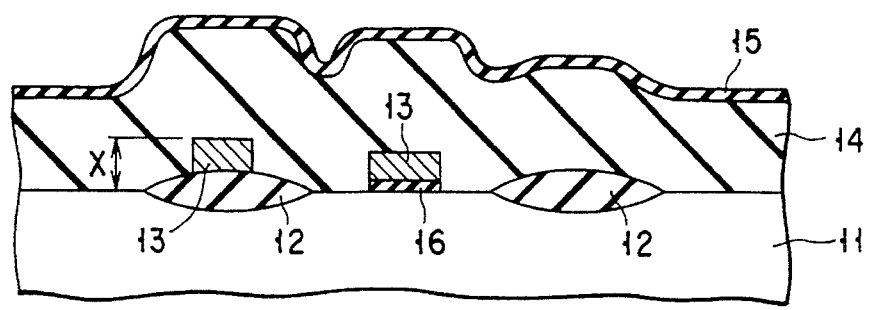
F I G. 5
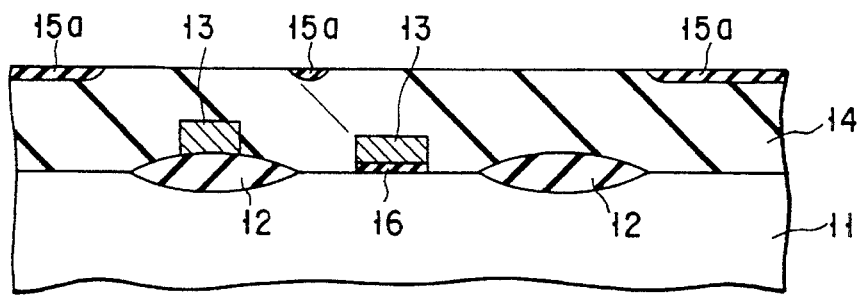
F I G. 6
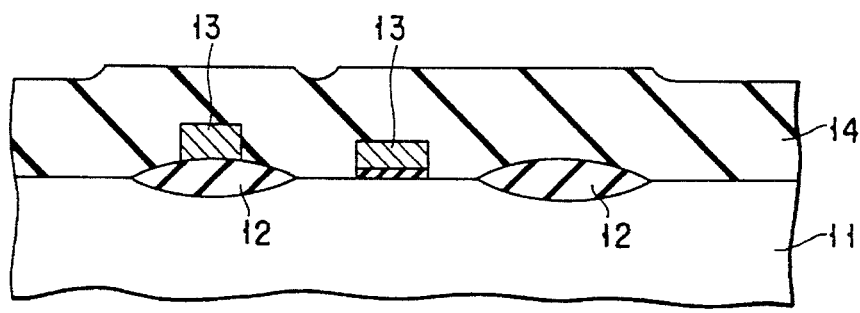
F I G. 7
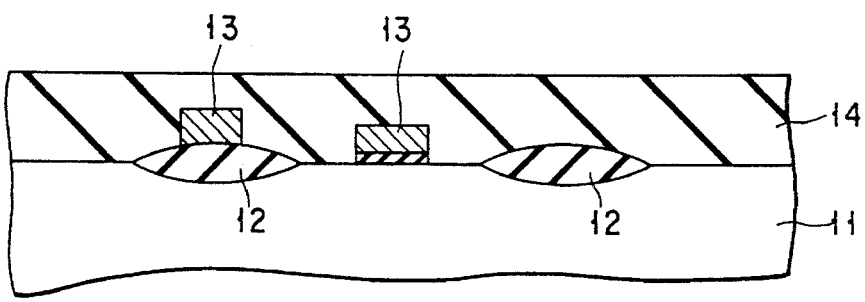
F I G. 8

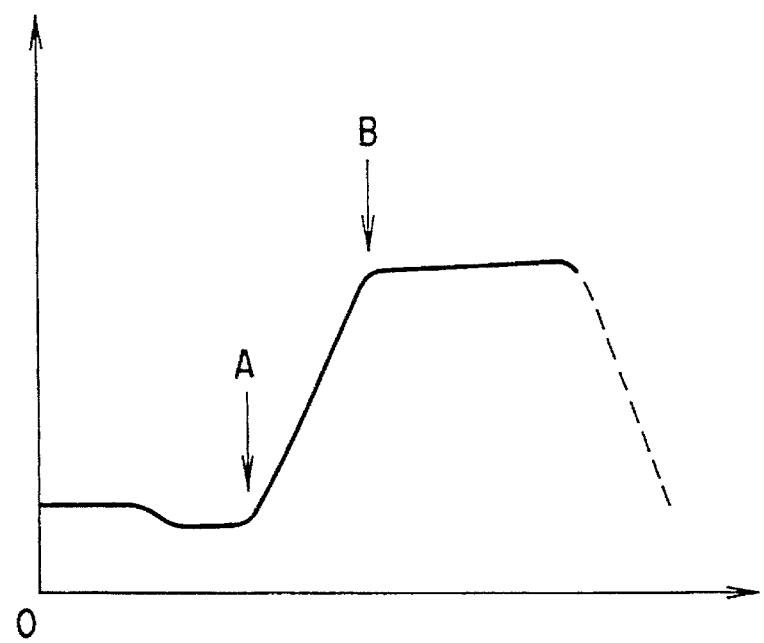
F I G. 9
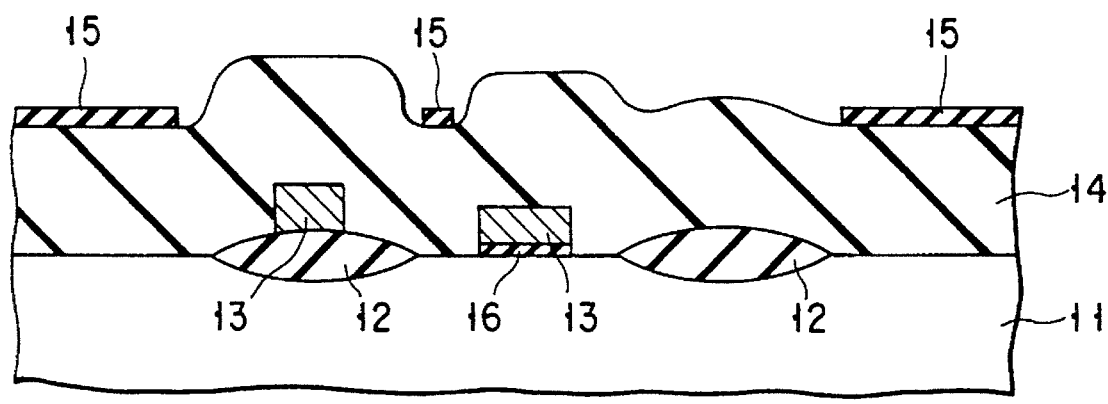
F I G. 10

METHOD OF MANUFACTURING SEMICONDUCTOR DEVICE HAVING A PLANARIZED SURFACE

BACKGROUND OF THE INVENTION

1. Field of the Invention

The present invention relates to a method of manufacturing a semiconductor device having a multi-layer wiring structure, and more particularly to a method of manufacturing a semiconductor device wherein a flattening step for an interlayer insulating film is improved.

2. Description of the Related Art

With reduction in size of a pattern of a semiconductor device, the surface configuration of the semiconductor device has been more complicated. On the other hand, with higher integration of circuit elements formed in a semiconductor device, the number of layers in a multi-layer wiring structure of the semiconductor device has increased more and more. In order to form a multi-layer structure, unevenness on the surface of the device needs to be flattened. Under the situation, a method of flattening an interlayer insulating film, etc. is very important. An example of such a flattening method is a CMP (Chemical Mechanical Polishing) method.

A conventional technique of flattening an insulating film with use of a CMP method will now be described with reference to FIG. 1.

A diffusion layer (not shown) of a transistor, etc. is formed on a semiconductor substrate 101. Then, a wiring layer 102 is formed on the semiconductor substrate 101 with a gate oxide film 105 interposed therebetween. An interlayer insulating film 103 is formed on the resultant structure. At this time, the surface of the interlayer insulating film 103 becomes uneven, as shown in FIG. 1, in accordance with the shape of the underlying wiring layer 102.

If the interlayer insulating film 103 is flattened by the CMP method, a dishing phenomenon occurs in the insulating film 103, as shown in FIG. 2.

According to another method, as shown in FIG. 3, a stopper film 104 having a lower polishing rate than the interlayer insulating film 103 is formed on the entire surface of the insulating film 103. Subsequently, the interlayer insulating film 103 is flattened by the CMP method. As a result, as shown in FIG. 4, a dishing phenomenon occurs in the insulating film 103. In the case where the stopper film 104 is provided, as the polishing step progresses to a certain horizontal point, the insulating film 103 and the stopper film 104 are polished at the same time. As a result, the polishing rate differs partly.

Specifically, the part of the insulating film 103 is polished more easily than the part of the stopper film 104. Owing to the load of the polishing table and the elasticity of the polishing pad, a recessed shape, as shown in FIG. 4, appears.

In order to prevent the dishing phenomenon, the interlayer insulating film 103 needs to be formed very thick. In this case, however, the polishing time and the manufacturing cost increase and the controllability is not good. Although there is a method of forming the stopper film 104 at only the recess of the interlayer insulating film, a lithography step is added (i.e. the cost increases). Besides, in order to prevent short-circuit between arranged wires, there is a method of forming a dummy pattern on the semiconductor substrate 101, thereby preventing provision of a space of a predetermined value between the wires. This, however, requires a precise pattern layout.

As has been described above, in the flattening method using the CMP method, a variance occurs in thickness of the polished interlayer insulating film owing to the unevenness of the pattern (chip pattern) underlying below the interlayer insulating film. In one method of preventing the variance, the thickness of the interlayer insulating film may be increased. In this case, however, the productivity decreases and the manufacturing cost increases.

SUMMARY OF THE INVENTION

It is accordingly the object of the present invention to provide a method of manufacturing a semiconductor device of a multi-layer wiring structure, including an improved step of flattening an interlayer insulating film, wherein a variance in thickness of a polished interlayer insulating film due to a chip pattern, etc. is prevented at the time of flattening the interlayer insulating film, etc., and the manufacturing cost can be reduced.

In order to achieve the above object, there is provided a method of manufacturing a semiconductor device, comprising the steps of:

forming an interlayer insulating film along a surface of a semiconductor substrate having an uneven surface;

forming a stopper surface at least on a recessed portion of the interlayer insulating film;

polishing the interlayer insulating film and the stopper film until the interlayer insulating film and the stopper film are exposed on the same plane;

etching and removing the stopper film remaining after the polishing step; and polishing and flattening the interlayer insulating film.

With the above structure, according to the method of manufacturing the semiconductor device of multi-layer wiring structure, including the improved step of flattening the interlayer insulating film, the variance in thickness of the polished interlayer insulating film due to an underlying pattern is easily prevented. In addition, since there is no need to form a dummy pattern for preventing dishing, the manufacturing cost can be prevented from rising.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-sectional view illustrating a manufacturing step of a method of manufacturing a semiconductor device according to an embodiment of the present invention;

FIG. 6 is a cross-sectional view showing the state in which a polishing operation is stopped when the interlayer insulating film and the stopper film have been polished at the same horizontal level, following the step of FIG. 5, and the interlayer insulating film and the stopper layer are exposed at the same horizontal level;

FIG. 7 is a cross-sectional view illustrating a step of selectively removing the stopper film by means of chemical etching in the state shown in FIG. 6;

FIG. 8 is a cross-sectional view showing a step of touching polishing the interlayer insulating film and flattening the surface of the interlayer insulating film, following the step shown in FIG. 7;

FIG. 9 is a graph showing a relationship between a torque current and a polishing time of a polishing table for polishing the interlayer insulating film and the stopper film of the semiconductor device according to the present invention; and FIG. 10 is a cross-sectional view illustrating a manufacturing step of a method of manufacturing a semiconductor device according to another embodiment of the invention.

DETAILED DESCRIPTION OF THE PREFERRED EMBODIMENTS

Figure 1:
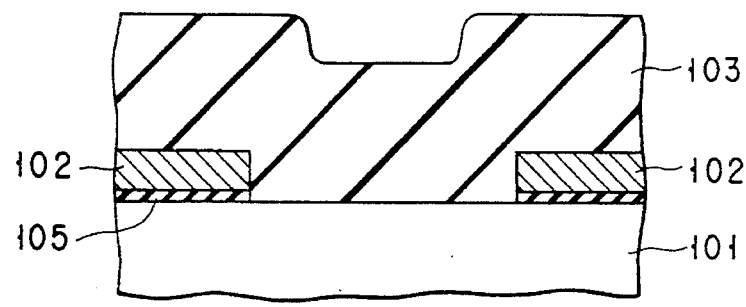
FIG. 1 is a cross-sectional view showing an example of a step of manufacturing a semiconductor device in a conventional method of flattening an interlayer insulating film, illustrating that unevenness of the surface of the interlayer insulating film occurs due to unevenness of an underlying layer on a semiconductor substrate.
Figure 2:
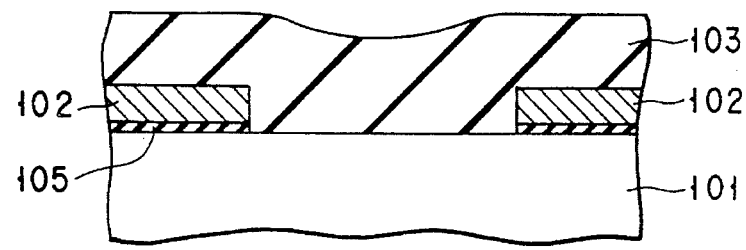
FIG. 2 is a cross-sectional view illustrating a dishing phenomenon occurring in the interlayer insulating film 103 when the interlayer insulating film is flattened by a CMP method after the step of FIG. 1.
Figure 3:
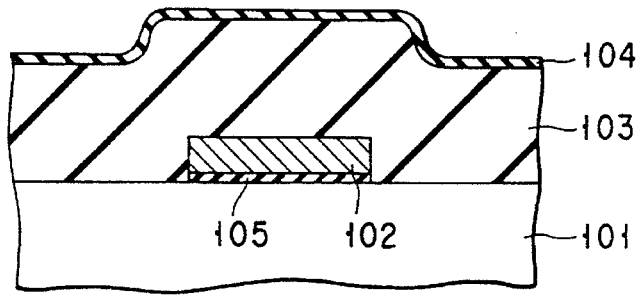
FIG. 3 is a cross-sectional view showing another example of a conventional step of manufacturing a semiconductor device, wherein a stopper film having a lower polishing rate than the interlayer insulating film is formed on the entire surface of the interlayer insulating film.
Figure 4:
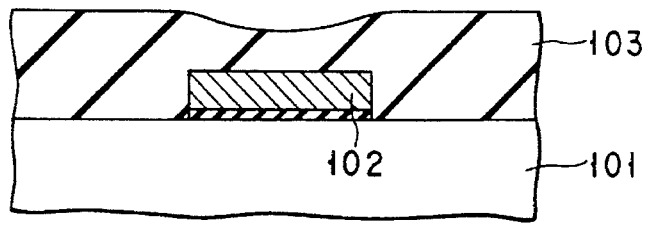
FIG. 4 is a cross-sectional view illustrating a dishing phenomenon occurring in the interlayer insulating film when the interlayer insulating film is flattened by a CMP method after the step of FIG. 3.

An embodiment of a method of manufacturing a semiconductor device according to the present invention will now be described with reference to FIGS. 5 to 9.

As is shown in FIG. 5, a device isolating film 12 and a gate oxide film 16 are formed on a semiconductor substrate 11. A gate electrode layer 13 is formed on a part of the device isolating film 12 and on the gate oxide film 16.

A semiconductor device including the gate electrode layer 13, e.g. a MOS transistor, is formed on the semiconductor substrate 11. An interlayer insulating film ($SiO_2$ film) 14 is deposited on the resultant structure by a CVD method to a desired thickness with an allowance of about 20%. A stopper layer (polysilicon film) 15 is formed on the entire surface of the interlayer insulating film 14.

A height from the upper surface of the semiconductor substrate 11 up to the highest gate electrode layer 13 is defined as an absolute step difference X. The polishing rate of the stopper film 15 is lower than that of the interlayer insulating film 14. The thickness of the stopper film 15 is set at 5 to 30% of the absolute step difference X on the basis of the ratio of the polishing rate of the stopper film 15 to that of the interlayer insulating film 14.

Then, as shown in FIG. 6, projections on the surface of the stopper film 15 are polished. The polishing is suspended in the state in which the surface of the stopper film 15 has been substantially flattened. In this state, the surface of the interlayer insulating film 14 and the surface of the stopper film 15a are exposed at the same horizontal level. The end point at which the polishing process is completed can be monitored, for example, by detecting a variation of a rotational torque current value relative to the polishing time of a polishing table (described later).

When a variation occurs in the degree of polishing within the wafer surface, the end point of the polishing is monitored in a thinnest region of the polished stopper film 15, i.e. a region with the highest polishing rate.

Subsequently, as shown in FIG. 7, the stopper film 15a is selectively removed by means of isotropic etching. As a result, a step difference corresponding to the thickness of the stopper film 15a appears on the surface of the interlayer insulating film 14.

As is shown in FIG. 8, the interlayer insulating film 14 is polished and completely flattened. The step difference of the interlayer insulating film 14, which is polished at this time, is much smaller than the absolute step difference X. Thus, the polishing of the interlayer insulating film 14 is completed in a short time period. A layer to be polished is only the interlayer insulating film 14, and the polishing rate is constant. Therefore, a dishing phenomenon can be prevented.

With respect to the polishing steps as shown in FIGS. 5 and 7, the polishing agent and polishing conditions (the number of rotations of the polishing table; a polishing load) can be changed.

The end point monitoring method, which makes use of the variation of the rotational torque current value of the polishing table, will now be described with reference to FIG. 9.

The abscissa indicates the polishing time, and the ordinate indicates the current value of rotational torque. In principle, the current value tends to increase in relation to an increase in polishing rate and to decrease in relation to a decrease in polishing rate.

At a point indicated by arrow A, the torque current value is low and the polishing rate is low. This indicates that the amount of polishing is small. That is, the projection of the stopper film 15a is being polished.

As the polishing progresses, the torque current value increases. At a point indicated by arrow B, the torque current value is constant. The projecting portion has been polished and the end point has been reached. This indicates that the torque current value is saturated and the entire surface of the wafer is being polished.

In the present embodiment, the horizontal end point of the polishing step is detected by using the variation of the torque current value. The invention, however, is not limited to this method.

Another embodiment of the method of manufacturing the semiconductor device of the invention will now be described with reference to FIG. 10.

As with the step shown in FIG. 5, a stopper film is formed on the entire surface of the interlayer insulating film 14. Then, lithography and anisotropic etching are performed to form a stopper film 15 only on a recessed portion of the interlayer insulating film 14. Thereafter, the interlayer insulating film 14 is flattened through the same step as shown in FIG. 6. Then, in the same manner as shown in FIG. 7, the stopper film 15 is selectively removed by isotropic etching. At last, the surface is flattened in a step similar to the step as shown in FIG. 8.

According to the present embodiment, the number of steps of patterning the stopper film 15 increases but the polishing time can be decreased since only the projecting portion of the interlayer insulating film 14 needs to be polished at first.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming an interlayer insulating film along a surface of a semiconductor substrate having a stepped surface;

forming a stopper film at least at a recess portion in said interlayer insulating film;

polishing said interlayer insulating film and said stopper film until said interlayer insulating film and said stopper film are exposed on the same plane;

etching and removing said stopper film remaining after said polishing step; and then polishing and flattening said interlayer insulating film.

2. The method according to claim 1, wherein in said step of forming said stopper film, said stopper film is formed along an entire surface of said interlayer insulating film.

3. The method according to claim 1, wherein said stopper film has a lower polishing rate than said interlayer insulating film.

* * * * *